United States Patent [19]
Baba et al.

[11] Patent Number: 5,467,041
[45] Date of Patent: Nov. 14, 1995

[54] VARIABLE DELAY BUFFER CIRCUIT

[75] Inventors: Mitsuo Baba; Yasushi Aoki, both of Tokyo, Japan

[73] Assignee: NEC Corporation, Tokyo, Japan

[21] Appl. No.: 264,617

[22] Filed: Jun. 23, 1994

[30] Foreign Application Priority Data

Jun. 23, 1993 [JP] Japan ................................. 5-176052

[51] Int. Cl.$^6$ ................................. H03K 5/13; H03L 7/00
[52] U.S. Cl. ........................... 327/276; 327/153; 327/161
[58] Field of Search .............................. 327/276, 277, 327/278, 161, 152, 153, 144, 154, 166, 407, 99, 163

[56] References Cited

U.S. PATENT DOCUMENTS

| | | | |
|---|---|---|---|
| 4,458,165 | 7/1984 | Jackson | 307/595 |
| 4,737,670 | 4/1988 | Chan | 307/602 |
| 5,103,185 | 4/1992 | Arai | 328/165 |
| 5,118,975 | 6/1992 | Hillis et al. | 307/602 |
| 5,327,031 | 7/1994 | Marbot et al. | 307/603 |

*Primary Examiner*—Timothy P. Callahan
*Assistant Examiner*—Eunja Shin
*Attorney, Agent, or Firm*—Young & Thompson

[57] ABSTRACT

A variable delay buffer circuit composed of a cascade of variable delay buffers, which realizes a delay in response to a delay control signal without any glitches. The delay buffers each have a selector circuit for selecting one of an input signal and a delayed signal produced by delaying in time the input signal in response to a delaying information. The delay buffers each contains a first control means and an output means. The first control means controls a timing of a input of the delaying information into the selector circuit in response to an external control signal. The output means outputs the control signal to by synchronized with an output signal from the selector circuit. Preferably, the first control means contains a latching means for latching the delay information and a second control means for controlling a timing in output of the delay information from the latching means in response to the control signal.

7 Claims, 6 Drawing Sheets

5,467,041

VARIABLE DELAY BUFFER CIRCUIT

BACKGROUND OF THE INVENTION

1. Field of the Invention

The present invention relates to a variable delay buffer circuit and more particularly, to a variable delay buffer circuit used for digital Integrated Circuits (Ics).

2. Description of the Prior Art

FIG. 1 shows an example of conventional variable delay buffer circuits of this sort. As the variable delay buffer circuit is generally composed of a cascade of k variable delay buffers, where k is an integer, only one of the delay buffers cascaded is shown in FIG. 1 for the sake of simplification of description.

In FIG. 1, a selector circuit 34 receives an input digital signal 301 inputted through a data input terminal 31 and a delayed input digital signal 302 produced in a delay circuit 32 by delaying in time the input digital signal 301 to select one of the signals 301 and 302. The signal thus selected in the selector circuit 34 is outputted through a data output terminal 35 as an output digital signal 311.

The selector circuit 34 also receives through an input terminal 33 a delay control signal 310 for controlling a delay time of the input digital signal 301, and selects one of the signals 301 and 302 in response to the control signal 310.

The conventional variable delay buffer circuit is composed of a plurality of the delay circuits shown in FIG. 1 cascaded by necessary stages, and the delay time of an output signal of the delay buffer circuit is set by changing the delay control signals inputted to the respective input terminals of the selector circuits.

With the conventional variable delay buffer circuit, the selection of the digital signals 301 and 302 and the change in state or level of the delay control signal 310 are carried out simultaneously in the selector circuit 34 shown in FIG. 1. Therefore, in the case that the changing time of the input digital signal 301 or the delayed digital signal 302 accords with the changing time of the control signal 310, the "glitch" due to distortion in a pulse waveform tends to occur in the output signal 311 because of the selection action in the selector circuit 34.

Thus, there is a problem that any digital circuit such as a flip-flop circuit tends to malfunction when the output digital signal 311 containing the glitch is used as a clock signal for the digital circuit.

SUMMARY OF THE INVENTION

Accordingly, an object of the present invention is to provide a variable delay buffer circuit which can realize delay in an output signal corresponding to a delay control signal without the glitch.

A variable delay buffer circuit according to the present invention includes a cascade of variable delay buffers. Each of the variable delay buffers has a delay circuit for delaying in time an input digital signal, and a selector circuit for selecting one of the input signal and the delayed digital signal in response to a delay control signal supplied to the selector circuit and for outputting the signal selected as an output digital signal.

The selector circuit has a first control means for controlling introduction timing of the delay control signal into the selector circuit in response to a timing control signal supplied to the selector circuit, and an output means for outputting the timing control signal to be synchronized with the output digital signal from the selector circuit.

In a preferred embodiment, the first control means contains a latch means for latching the delay control signal, and a second control means for controlling an output timing of the delay control signal from the selector circuit in response to the timing control signal.

With the variable delay buffer circuit according to the present invention, the first control means controls the timing for inputting the delaying information into the selector circuit in response to the timing control signal, and the output means outputs the timing control signal to be synchronized with the output digital signal from the selector circuit.

Therefore, a delay corresponding to the delay control signal can be realized in the output digital signal of the variable delay buffer circuit without arising the glitch.

DESCRIPTION OF THE PREFERRED EMBODIMENTS

Figure 1:
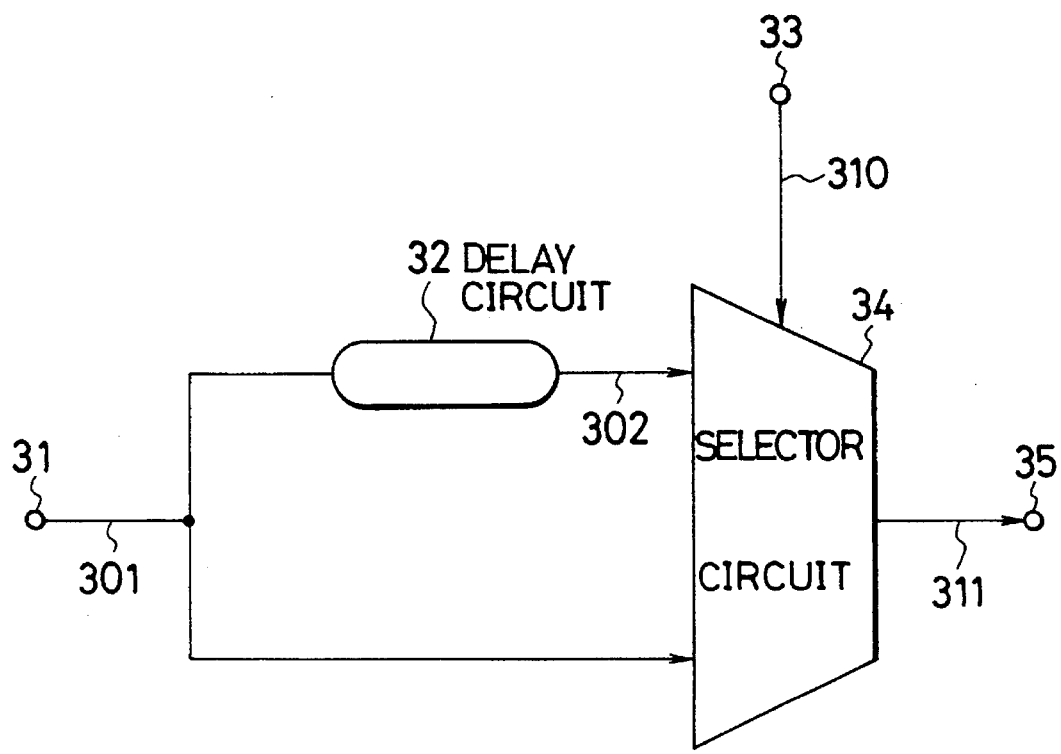
FIG. 1 is a functional block diagram of a conventional variable delay buffer circuit, in which only one of the variable delay buffers cascaded therein is shown.

A preferred embodiment of the present invention will be described below while referring to the drawings attached.

FIGS. 2 to 6 show a variable delay buffer circuit according to an embodiment of the present invention.

Figure 3:
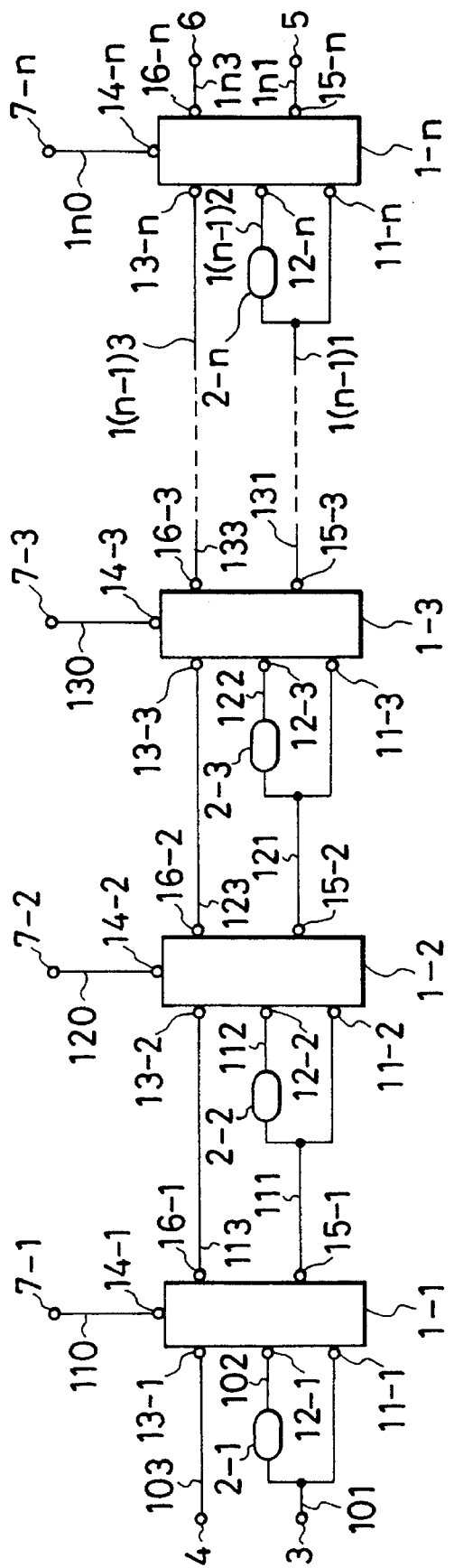
FIG. 3 is a function block diagram of the variable delay buffer circuit according to the first embodiment.

As shown in FIG. 3, the variable delay buffer circuit is composed of a cascade of n variable delay buffers where n is an integer. The delay buffers contain selector circuits 1—1 to 1-n and delay circuits 2-1 to 2-n, respectively.

The reference numeral 3 is a first input terminal through which an initial input digital signal 101 is supplied. The reference numeral 4 is a second input terminal through which a timing control signal 103 is supplied. The reference numeral 5 is a first output terminal from which an output digital signal $1n1$ is derived. The reference numeral 6 is a second output terminal from which a timing control signal $1n3$ is derived.

The reference numerals 7-1, 7-2, 7-3, . . . , 7-n are third input terminals through which a set of delay control signals 110, 120, 130, . . . , $1n0$ are supplied to respective selector circuits 1—1, 1-2, 1-3, . . . , and 1-n.

Figure 2:
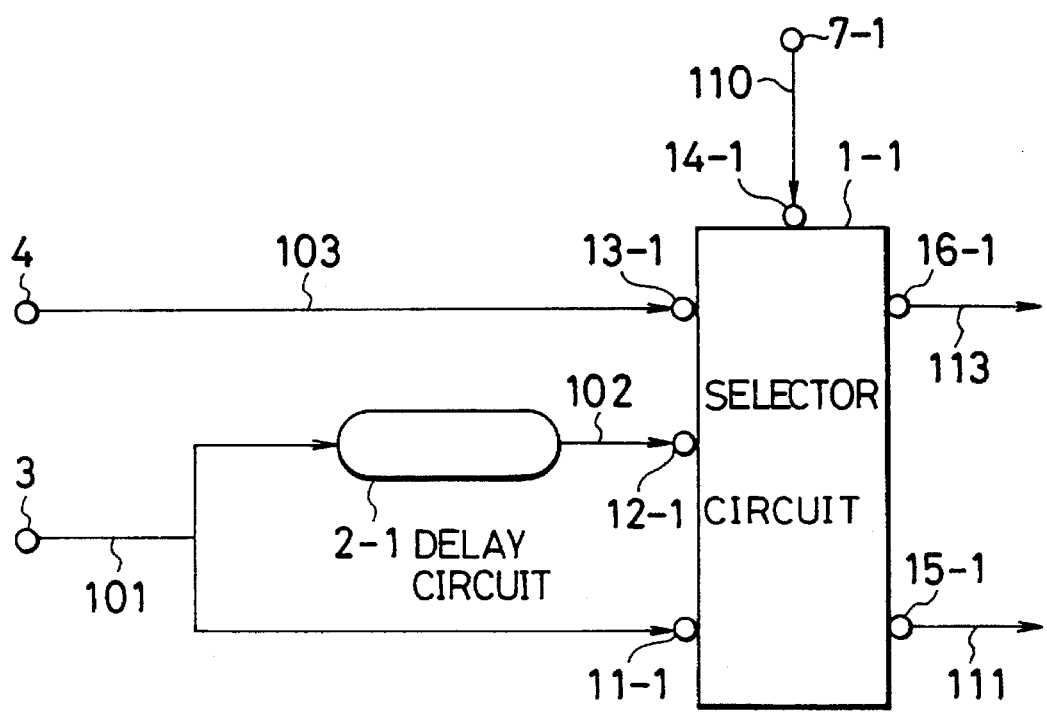
FIG. 2 is a functional block diagram of a variable delay buffer circuit according to a first embodiment of the present invention, in which only one of the variable delay buffers cascaded therein is shown.

As shown in FIG. 2, the first variable delay buffer at a first stage includes the first selector circuit 1—1 and the first delay circuit 2-1.

The initial input digital signal 101 is supplied through the first input terminal 3 and is inputted into the first selector circuit 1—1 through its data input end 11-1 and the first delay circuit 2-1, simultaneously.

The delayed digital signal 102 is produced in the first delay circuit 2-1 by delaying in time the initial input digital signal 101, and the delayed signal 102 thus produced is inputted into the first selector circuit 1—1 through its data input end 12-1.

The timing control signal 103 is supplied through the second input terminal 4 and is inputted into the first selector circuit 1—1 through its timing control signal input end 13-1.

The delay control signal 110 is supplied through the third input terminal 7-1 and is introduced into the first selector circuit 1—1 through its delay control signal input end 14-1 in response to the timing control signal 103.

The first selector circuit 1—1 selects one of the initial input digital signal 101 and the delayed digital signal 102 to output the selected one as an output digital signal 111 from its data output end 15-1 toward the second selector circuit 1-2 and the second delay circuit 2—2 of the second variable delay buffer at the second stage. The output digital signal 111 is inputted into the second selector circuit 1-2 through its input end 11-2.

The first selector circuit 1—1 also outputs from its timing control signal output end 16-1 a timing control signal 113 to be synchronized with the output digital signal 111 toward the second selector circuit 1-2. The timing control signal 113 is inputted into the second selector circuit 1-2 through its input end 13-2.

The second to n-th variable delay buffers respectively arranged at the second to n-th stages are the same in configuration and function as the first variable delay buffer shown in FIG. 2.

With the second variable delay buffer, the second selector circuit 1-2 selects one of the output digital signal 111 and the delayed digital signal 112 to output the selected one from its data output end 15-2 to the third selector circuit 1-3 and the third delay circuit 2-3 as an output digital signal 121. The signal 121 is inputted into the third selector circuit 1-3 through its input end 11-3 and the third delay circuit 2-3, simultaneously.

A delay control signal 120 is supplied through the third input terminal 7-2 and is introduced into the second selector circuit 1-2 through its delay control signal input end 14-2 in response to the timing control signal 113.

The second selector circuit 1-2 also outputs from its output end 16-2 a timing control signal 123 to be synchronized with the output digital signal 121 to the third selector circuit 1-3. The signal 123 is inputted into the third selector circuit 1-3 through its input end 13-3.

With the third variable delay buffer, the third selector circuit 1-3 selects one of the output digital signal 121 and the delayed signal 122 to output the selected one from its data output end 15-3 to the fourth selector circuit (not shown) and the fourth delay circuit (not shown) as an output digital signal 131. The signal 131 is inputted into the fourth selector circuit through its input end and the fourth delay circuit, simultaneously.

An delay control signal 130 is supplied through the control signal input terminal 7-3 and is introduced into the third selector circuit 1-3 through its delay control signal input end 14-3 in response to the timing control signal 123.

The third selector circuit 1-3 also outputs from its output end 16-3 a timing control signal 133 to be synchronized with the output digital signal 131 to the fourth selector circuit. The signal 133 is inputted into the fourth selector circuit through its input end.

In the same way, with the n-th variable delay buffer at the n-th stage, the n-th selector circuit 1-n is supplied through its input end 11-n with an output digital signal 1(n-1)1 from the (n-1)th selector circuit (not shown).

The n-th delay circuit 2-n is supplied with the output digital signal 1(n-1)1 from the (n-1) selector circuit, and produces a delayed signal 1(n-1)2 from the signal 1(n-1)1 to output it to the n-th selector circuit 1-n through its input end 12-n.

The n-th selector circuit 1-n selects one of the output digital signal 1(n-1)1 and the delayed signal 1(n-1)2 to output the selected one from its data output end 15-n to the first output terminal 5.

The n-th selector circuit 1-n is also supplied through its input end 13-n with a timing control signal 1(n-1)3 outputted from the (n-1)th selector circuit.

A delay control signal 1n0 is supplied from an input terminal 7-n of the variable delay buffer circuit to an input end 14-n of the n-th selector circuit 1-n. The delay control signal 1n0 is introduced into the circuit 1-n in response to the timing control signal 1(n-1)3.

The n-th selector circuit 1-n also outputs from its output end 16-n a timing control signal 1n3 to the second output terminal 6 to be synchronized with the output digital signal 1n1 to.

Figure 4:
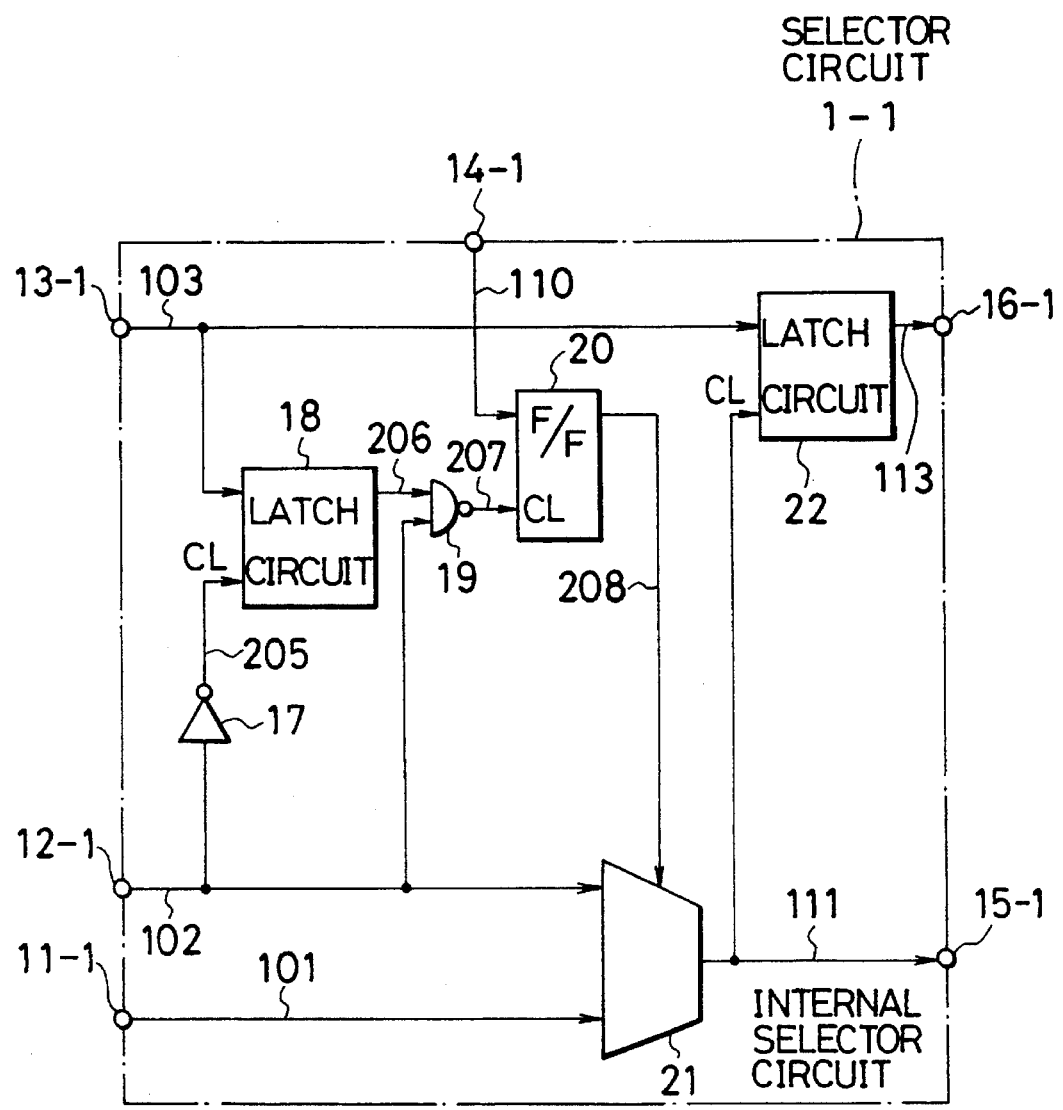
FIG. 4 is a functional block diagram of the selector circuit in the variable delay buffer circuit shown in FIG. 2.

FIG. 4 shows a detailed configuration of the first selector circuit 1—1 in FIG. 2.

As shown in FIG. 4, the first selector circuit 1—1 is comprised of an inverter circuit 17, a first latch circuit 18, an NAND logic circuit 19, a flip-flop (F/F) circuit 20, an internal selector circuit 21, and a second latch circuit 22.

The inverter circuit 17 receives the delayed digital signal 102 supplied through the data input end 12-1 and outputs an inverted digital signal 205 produced therein by inverting in logic the signal 102 to the first latch circuit 18 as its clock signal.

The first latch circuit 18 receives the timing control signal 103 supplied through the timing control signal input end 13-1 to latch the signal 103. The latch circuit 18 outputs the timing control signal 103 thus latched as an output signal 206 to the NAND logic circuit 19 in response to the inverted signal 205.

The NAND logic circuit 19 receives the delayed digital signal 102 and the output signal 206 and operates the NAND logic function of the signals 102 and 206, and then outputs the operation result to the F/F circuit 20 as an output signal 207.

The F/F circuit 20 receives the output signal 207 from the NAND logic circuit 19 as its clock signal and latches the delay control signal 110 supplied through the input end 14–1. The F/F circuit 20 outputs the delay control signal 110 thus latched to the internal selector circuit 21 as an output signal 208 in response to the output signal 207.

The internal selector circuit 21 receives the initial input digital signal 101 supplied through the data input end 11-1 and the delayed digital signal 102 and selects one of the signals 101 and 102 in response to the output signal 208 from the F/F circuit 20. Then, the internal selector circuit 20 outputs an output digital signal 111 to the output end 15-1 and the second latch circuit 22.

The second latch circuit 22 receives the output digital signal 111 from the internal selector circuit 21 as its clock signal and the timing control signal 103. The second latch circuit 22 latches the signal 103 in response to the output digital signal 111 and outputs the timing control signal 103 thus latched to the output end 16-1 as a timing control signal 113.

The second to n-th selector circuits 1—1 to 1-n are the same in configuration and function as the first selector circuit 1—1, respectively.

Figure 5:
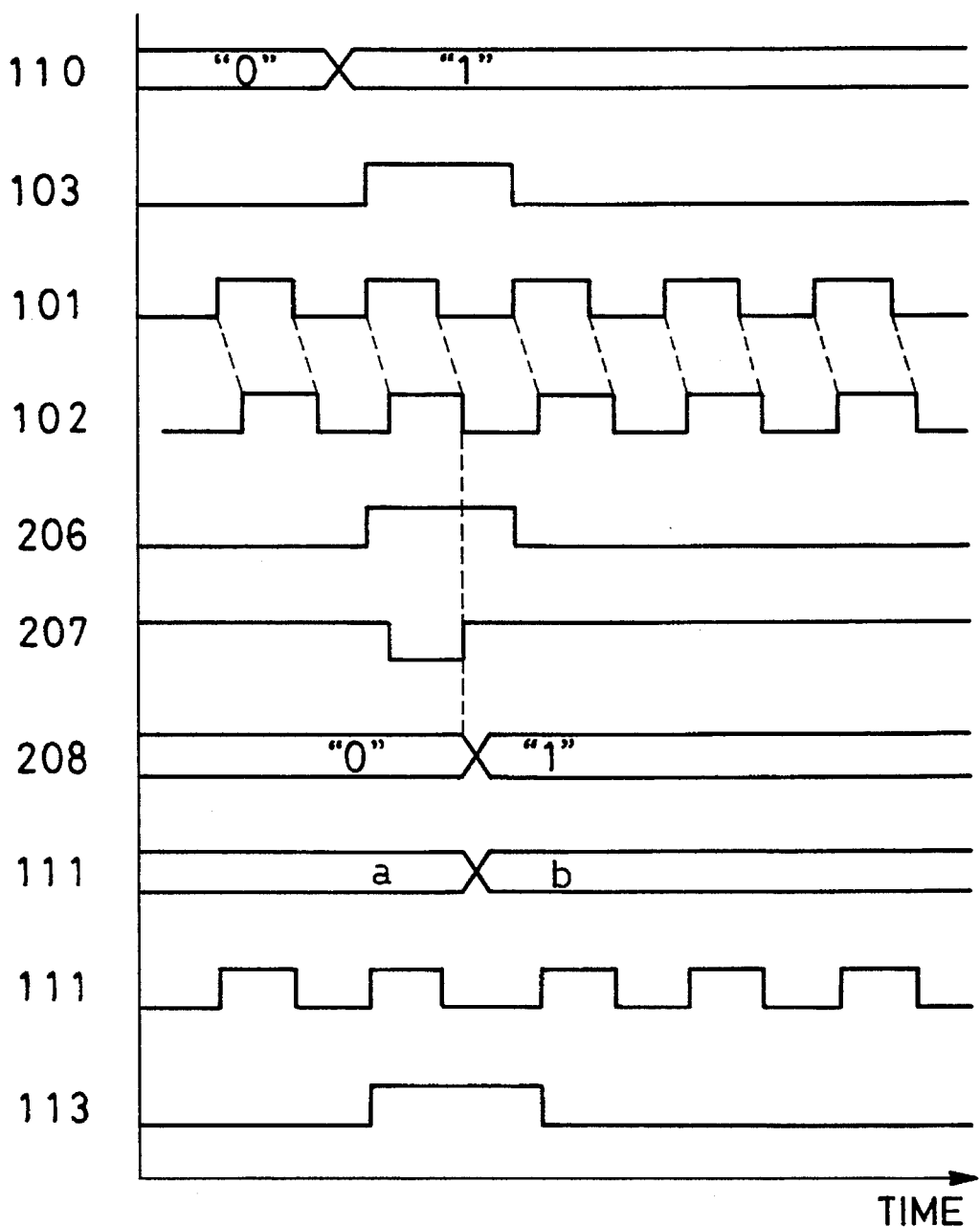
FIG. 5 is a timing chart diagram showing an operation of the selector circuit in FIG. 2.
Figure 6:
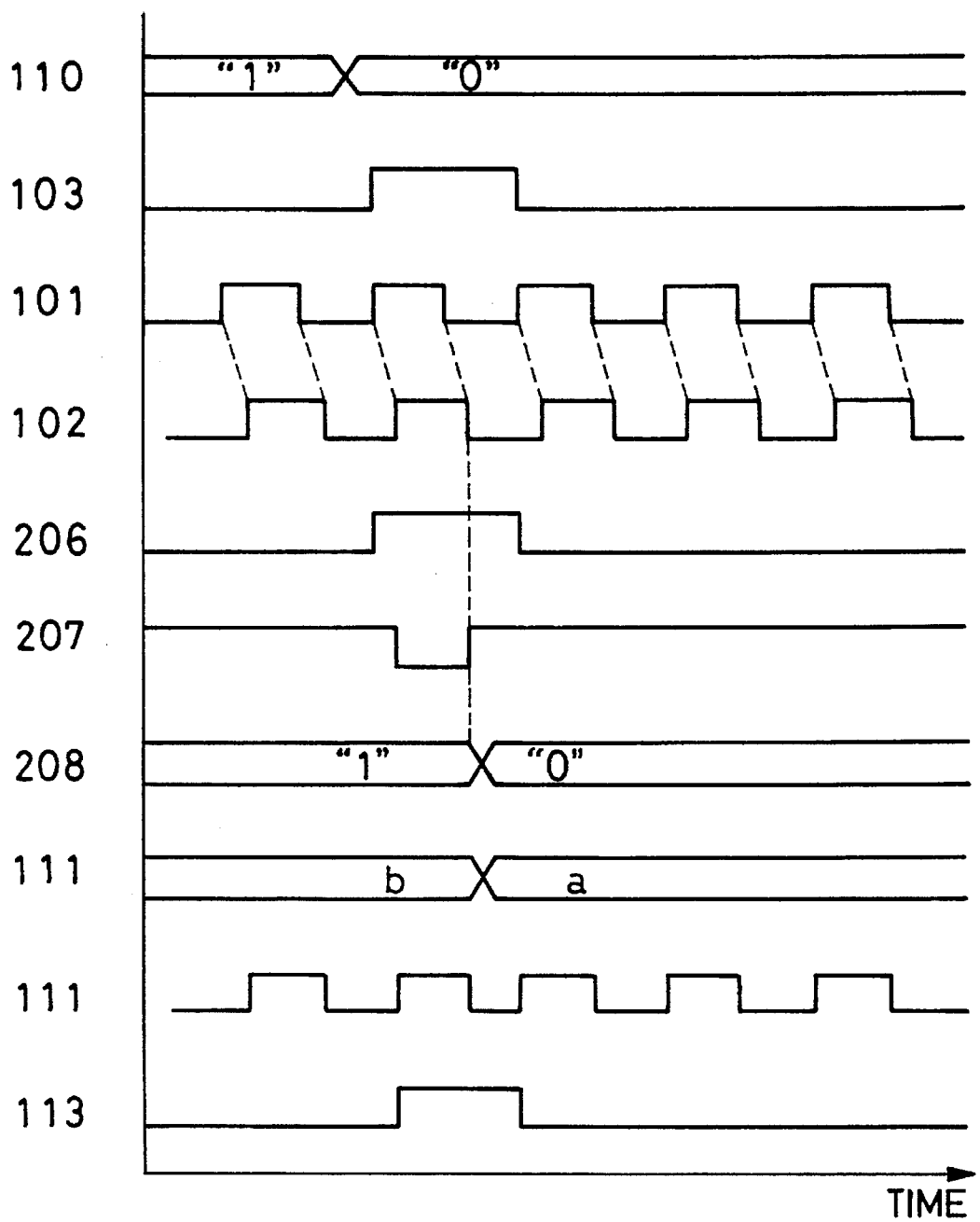
FIG. 6 is a timing chart diagram showing an operation of the selector circuit in FIG. 2.

FIGS. 5 and 6 are timing charts for showing operation of the first selector circuit 1—1 shown in FIG. 4.

We suppose that the initial input digital signal 101 has a meaning or content of a and the delayed digital signal 202 has a meaning or content of b.

In FIG. 5, there is shown the case that the internal selector circuit 21 selects the delayed digital signal 102 instead of the initial input digital signal 101.

As shown in FIG. 5, when the delay control signal 110 changes in value from the low level "0" to the high level "1", there arises a pulse whose rising edge is delayed in time from the change timing of the signal 110 in the timing control signal 103.

When the timing control signal 103 changes in value from the low level to the high level, the first latch circuit 18 outputs the timing control signal 103 latched therein to the NAND logic circuit 19 if the inverted signal 205 from the inverter 17, which is used as the clock signal for the latch circuit 18, is at the high level "1".

The F/F circuit 20 outputs the delay control signal 110 latched therein to the internal selector circuit 21 as the output signal 208 to be synchronized with the timing when the output signal 207 from the NAND logic circuit 19 changes from the low level "0" to the high level "1", that is, when the clock signal for the F/F circuit 20 rises. In this case, the output signal 208 has a rising edge synchronized with the falling edge of the delayed signal 102.

The internal selector circuit 21 uses the output signal 208 outputted from the F/F circuit 20 as its selection control signal. In response to the output signal 208, the selector circuit 21 selects one of the initial input digital signal 101 and the delayed signal 102 to output the selected one to the output end 15-1 as the output digital signal 111.

Here, the output signal 208 changes in value from the low level "0" to the high level "0", so that selector circuit 21 selects to output the delayed signal 102 instead of the initial input digital signal 101 selected previously. As a result, the meaning or content of the output signal 111 changes from a to b.

The second latch circuit 22 latches the timing control signal 103 when the output digital signal 111 as the clock signal for the circuit 22 is at the low level "0". In other words, the second latch circuit 22 latches the timing control signal 103 whose logic level is high or "1" when the initial input digital signal 101 previously selected by the circuit 21 is at the low level "0".

The second latch circuit 22 latches the timing control signal 103 whose logic level is high or "1" by the timing when the delayed signal 102 selected by the circuit 22 instead of the initial input digital signal 101 becomes to the high level "1". The timing control signal 103 is outputted to the output end 16-1 as the timing control signal 113 for the second stage.

In FIG. 6, there is shown the case that the internal selector circuit 21 selects the initial input digital signal 101 instead of the delayed signal 102.

As shown in FIG. 6, the delay control signal 110 changes in value from the high level "1" to the low level "0". There arises a pulse whose rising edge is delayed in time from the change timing of the signal 110 in the timing control signal 103.

When the timing control signal 103 changes in value from the low level to the high level, the first latch circuit 18 outputs the timing control signal 103 latched therein to the NAND logical circuit 19 if the inverted signal 205 from the inverter 17, which is used as the clock signal for the latch circuit 18, is at the high level "1".

The F/F circuit 20 outputs the delay control signal 110 latched therein to the internal selector circuit 21 as the output signal 208 to be synchronized with the timing when the output signal 207 from the NAND logic circuit 19 changes from the low level "0" to the high level "1", that is, when the clock signal for the F/F circuit 20 rises. In this case, the output signal 208 has a rising edge synchronized with the falling edge of the delayed signal 102.

In response to the output signal 208, the selector circuit 21 selects one of the initial input digital signal 101 and the delayed signal 102 to output the selected one to the output end 15-1 as the output digital signal 111.

Here, the output signal 208 changes in value from the high level "1" to the low level "0", so that the internal selector circuit 21 selects to output the initial input digital signal 101 instead of the delayed signal 102 selected previously. As a result, the meaning or content of the output signal 111 changes from b to a.

The second latch circuit 22 latches the timing control signal 103 when the output digital signal 111 as the clock signal for the circuit 22 is at the low level "0". In other words, the second latch circuit 22 latches the timing control signal 103 whose logic level is high or "1" when the initial input digital signal 101 previously selected by the circuit 21 is at the low level "0".

The second latch circuit 22 latches the timing control signal 103 whose logic level is high or "1" by the timing when the delayed signal 102 selected by the circuit 21 instead of the initial input digital signal 101 becomes to the high level "1". The timing control signal 103 is outputted to the output end 16-1 as the timing control signal 113 for the second stage.

As described above, with the first selector circuit 1—1, the delay control signal 110 is introduced into the F/F circuit 20 of the first selector circuit 1—1 in response to the timing control signal 103. Also, the internal selector circuit 21 uses as its selection control signal the output signal 208 from the F/F circuit 20, which has the rising edge synchronized with the falling edge of the delayed signal 102.

Therefore, the first variable delay buffer shown in FIG. 2 can provide any delayed digital signal 111 in response to the delay control signal 110 with arising no glitch in the digital signal 111.

Since the variable delay buffer circuit of the embodiment is composed of a cascade of the first to n-th variable delay buffers and the second to n-th variable delay buffers are the same in configuration and function as the first variable delay buffer, the variable delay buffer circuit can provide any delayed digital signal 1n1 at the output terminal 5 in response to the delay control signal 110 without arising the glitch in the digital signal 1n1.

Additionally, the variable delay buffer circuit can provide the timing control signal 1n3 synchronized with the digital output signal 1n1 at the output terminal 6.

The variable delay buffer circuit of the embodiment is composed of a cascade of n variable delay buffers, in other words, it contains n stages. Therefore, the circuit can provide various values of $2^n$ in delay.

Needless to say, the present invention is not limited to the embodiment and any configurations other than those described herewith are applicable for the inverter circuit 17, the first latch circuit 18, the NAND logic circuit 19, the F/F circuit 20, the internal selector circuit 21, and the second latch circuit 22.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A variable delay buffer circuit including a cascade of variable delay buffers, each of said variable delay buffers comprising:

(a) a delay circuit for delaying in time an input digital signal to produce a delayed digital signal (b) a selector circuit for selecting one of said input digital signal and said delayed digital signal in response to a delay control signal supplied to said selector circuit and for outputting one of said signals thus selected as a selector circuit output signal;

(c) said selector circuit comprising:

a delay control signal actuation control means for controlling a timing of an actuation of said delay control signal in response to a timing control signal supplied to said selector circuit;

an internal selection means for selecting one of said input digital signal and said delayed digital signal in response to an activation timing control signal generated by said actuation timing control means, said internal selection means outputting said output signal of said selector circuit; and a timing control signal output means for receiving said timing control signal and for outputting a timing control signal to be synchronized with said output signal from said internal selection means.

2. A variable delay buffer circuit as claimed in claim 1, wherein said delay control signal actuation control means of said selector circuit comprises:

a latch means for latching said delay control signal; and a an output timing control means for controlling an output timing of said delay control signal latched in said latch means from said selector circuit in response to said timing control signal.

3. A variable delay buffer circuit as claimed in claim 2, wherein said latch means comprise a flip-flop circuit, said flip-flop circuit being supplied with said delay control signal and latching said delay control signal thus supplied;

said output timing control means comprising a first latch circuit and a logic circuit;

said first latch circuit being supplied with said timing control signal and with said delayed digital signal as its clock signal;

said logic circuit being supplied with an output signal from said first latch circuit and with said delayed digital signal to produce a logic circuit output signal based on a logic operation result of said logic circuit;

said flip-flop circuit being supplied with said logic circuit output signal from said logic circuit as its clock signal to output an internal selection means delay control signal to said internal selection means; and said internal selection means selecting one of said input digital signal and said delayed digital signal in accordance with said internal selection means delay control signal from said flip-flop circuit.

4. A variable delay buffer circuit as claimed in claim 3, wherein said output means further comprises a second latch circuit for latching said timing control signal;

said second latch circuit being supplied with said selector circuit output signal from said internal selector circuit as its clock signal; and said second latch circuit outputting said timing control signal in response to said output signal from said selector circuit to output said timing control signal.

5. A variable delay buffer circuit including a cascade of variable delay buffers, each of said variable delay buffers comprising:

(a) a delay circuit for delaying in time an input signal;

(b) a selector circuit for selecting one of said input signal and said delayed input signal in response to a delay control signal supplied to said selector circuit to output one of said signals thus selected as an output signal;

(c) said selector circuit being supplied with a timing control signal; and (d) said selector circuit having:

a first latch circuit which is supplied with said timing control signal to latch said timing control signal;

said first latch circuit which is supplied with said delayed signal as its clock signal;

a logic circuit which is supplied with an output from said first latch circuit and said delayed signal;

a flip-flop circuit which is supplied with said delay control signal to latch said delay control signal;

said flip-flop circuit which is supplied with an output from said logic circuit as its clock signal;

an internal selector circuit which is supplied with said input signal and said delayed signal;

said internal selector which selects one of said input signal and said delayed signal to output selected one in response to an output from said flip-flop circuit;

a second latch circuit which is supplied with said timing control signal to latch said timing control signal;

said second latch circuit which is supplied with said output signal from said internal selector circuit as a clock signal.

6. A variable delay buffer circuit according to claim 1, wherein said cascade of variable delay buffers is configured as a cascade arrangement of first to nth variable delay buffers, each of said timing control signals and said selector circuit output signals of each of said variable delay buffers being connected, respectively, to said timing control signals and to said input digital signals of subsequent variable delay buffers in said cascade arrangement of variable delay buffers, a selector circuit output signal of said nth variable delay buffer constituting an output signal of said variable delay buffer circuit.

7. A variable delay buffer circuit according to claim 5, wherein said cascade of variable delay buffers is configured as a cascade arrangement of first to nth variable delay buffers, each of said timing control signals and said selector circuit output signals of each of said variable delay buffers being connected, respectively, to said timing control signals and to said input digital signals of subsequent variable delay buffers in said cascade arrangement of variable delay buffers, a selector circuit output signal of said nth variable delay buffer constituting an output signal of said variable delay buffer circuit.

* * * * *